(12) United States Patent
Lu

(10) Patent No.: US 9,433,126 B2
(45) Date of Patent: Aug. 30, 2016

(54) ELECTRONIC DEVICE AND HEAT DISSIPATION MODULE AND CENTRIFUGAL FAN THEREOF

(75) Inventor: Chao-Wen Lu, Taoyuan Hsien (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 968 days.

(21) Appl. No.: 13/613,940

(22) Filed: Sep. 13, 2012

(65) Prior Publication Data

US 2013/0068425 A1 Mar. 21, 2013

Related U.S. Application Data

(60) Provisional application No. 61/536,344, filed on Sep. 19, 2011.

(51) Int. Cl.
| | |
|---|---|
| H05K 7/20 | (2006.01) |
| H01L 23/467 | (2006.01) |
| G06F 1/20 | (2006.01) |
| H01L 23/427 | (2006.01) |

(52) U.S. Cl.
CPC ........... *H05K 7/20172* (2013.01); *G06F 1/203* (2013.01); *H01L 23/467* (2013.01); *H01L 23/427* (2013.01); *H01L 2924/0002* (2013.01)

(58) Field of Classification Search
CPC .... F04D 1/04; F04D 15/0005; F04D 15/011; F04D 17/06; F04D 17/08; F04D 25/14; F04D 29/002; F04D 29/403; F04D 29/42; F04D 29/4206; F04D 29/4213; F04D 29/44; F04D 29/441; F04D 29/661; F04D 29/667; F04D 29/4226; F04D 29/684; H05K 7/20145; H05K 7/20154; H05K 7/20172; H05K 7/20181; G06F 1/203; H01L 23/467; H01L 23/427
See application file for complete search history.

(56) References Cited

U.S. PATENT DOCUMENTS

| | | | | |
|---|---|---|---|---|
| 2,050,523 A | * | 8/1936 | Freed | F04D 29/441 415/116 |
| 2,981,461 A | * | 4/1961 | Murphy | F04D 29/4213 415/118 |
| 3,796,511 A | * | 3/1974 | Hansen | F04D 29/701 415/144 |
| 5,570,996 A | * | 11/1996 | Smiley, III | F04D 29/4226 415/204 |
| 6,179,562 B1 | * | 1/2001 | Fujinaka | F04D 19/002 415/119 |
| 6,643,129 B2 | * | 11/2003 | Fujiwara | G06F 1/203 165/104.33 |
| 6,781,835 B2 | * | 8/2004 | Hashimoto | F04D 29/4213 165/121 |
| 2005/0082035 A1 | * | 4/2005 | Debashisu | H01L 23/467 165/80.3 |

(Continued)

FOREIGN PATENT DOCUMENTS

TW    I262991    10/2006

*Primary Examiner* — Craig Kim
*Assistant Examiner* — Wayne A Lambert
(74) *Attorney, Agent, or Firm* — Muncy, Geissler, Olds & Lowe, P.C.

(57) ABSTRACT

A centrifugal fan includes an impeller and a housing. The housing includes an upper plate, a lower plate and a side wall, wherein the upper plate axially corresponds to the lower plate, a side wall is formed between the upper plate and the lower plate, an axial inlet is formed on the upper plate, a lateral outlet is formed on the side wall, the impeller is disposed in the housing and corresponds to the inlet, and a flow path communicates the inlet to the outlet. The housing further includes a guiding groove, and at least one auxiliary inlet is formed in the guiding groove.

18 Claims, 4 Drawing Sheets

(56) References Cited

U.S. PATENT DOCUMENTS

| | | | |
|---|---|---|---|
| 2006/0024160 A1* | 2/2006 | Horng | F04D 29/4226 415/206 |
| 2009/0232648 A1* | 9/2009 | Wu | F04D 29/4226 415/204 |
| 2010/0065254 A1* | 3/2010 | Chang | G06F 1/203 165/104.26 |
| 2011/0097195 A1* | 4/2011 | Horng | F04D 27/004 415/121.2 |
| 2014/0099197 A1* | 4/2014 | Chen | F04D 17/162 415/206 |

* cited by examiner

ELECTRONIC DEVICE AND HEAT DISSIPATION MODULE AND CENTRIFUGAL FAN THEREOF

CROSS REFERENCE TO RELATED APPLICATIONS

This application claims the benefit of U.S. Provisional Application No. 61/536,344, filed Sep. 19, 2011, the entirety of which is incorporated by reference herein.

BACKGROUND OF THE INVENTION

1. Field of the Invention

The present invention relates to a fan, and in particular, relates to a centrifugal fan.

2. Description of the Related Art

Portable computers (for example, tablet computers or ultrabooks) are extremely thin, and the inner space therein is limited. The dimensions of the centrifugal fan disposed in the portable computer have decreased, and the space between the centrifugal fan and other elements inside of the portable computer has reduced. The heat dissipation effect of the centrifugal fan has therefore deteriorated. Particularly, with limited inner space, the output flow of the centrifugal fan is not uniformly output from the outlet, and the heat dissipation effect has worsened.

TW Patent No. I262991 discloses a centrifugal fan with radial auxiliary inlets formed on a side wall of a housing of the centrifugal fan. However, in TW Patent No. I262991, the radial auxiliary inlets face to an impeller of the centrifugal fan, and the radial auxiliary inlets are located in a low pressure area of the centrifugal fan. Therefore, in TW Patent No. I262991, there is eddy flow is undesirably higher, and the input flow rate is undesirably lower.

BRIEF SUMMARY OF THE INVENTION

In one embodiment of the invention, a centrifugal fan is provided. The centrifugal fan includes an impeller and a housing. The housing includes an upper plate, a lower plate and a side wall, wherein the upper plate axially corresponds to the lower plate, a side wall is formed between the upper plate and the lower plate, an axial inlet is formed on the upper plate, a lateral outlet is formed on the side wall, the impeller is disposed in the housing and corresponds to the inlet, and a flow path communicates the inlet to the outlet, wherein the housing further comprises a guiding groove, and at least one auxiliary inlet is formed in the guiding groove.

Utilizing the centrifugal fan of the embodiment of the invention, the auxiliary inlets are formed in the low pressure area. Thus, auxiliary flow is sufficiently impelled, eddy flow is prevented, flow rate is increased, and uniformity of the output flow is improved. Even in an electronic device with limited inner space, the centrifugal fan of the embodiment of the invention provides improved heat dissipation effect.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
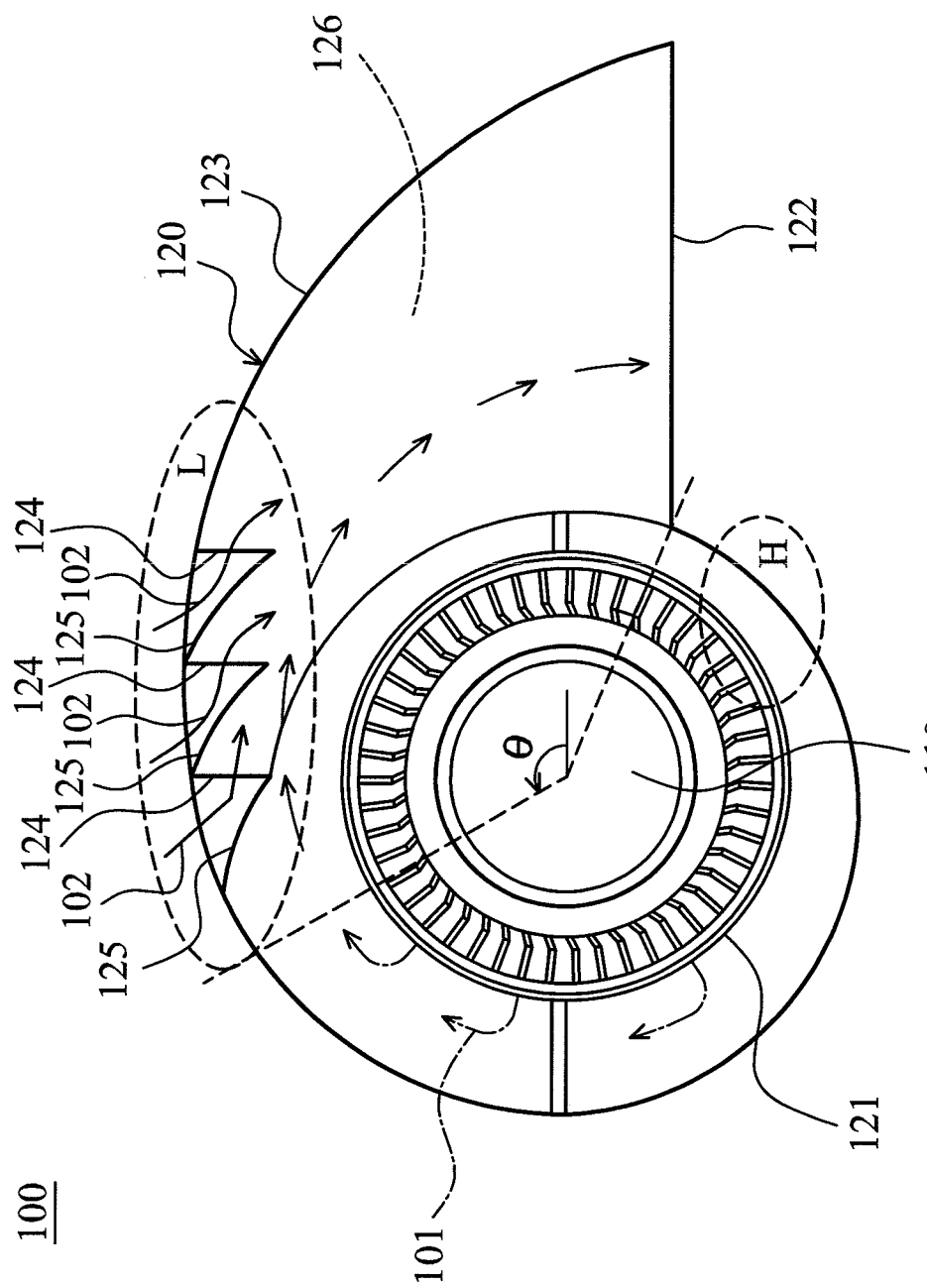
FIG. 1A is a top view of the centrifugal fan of an embodiment of the invention.
Figure 1B:
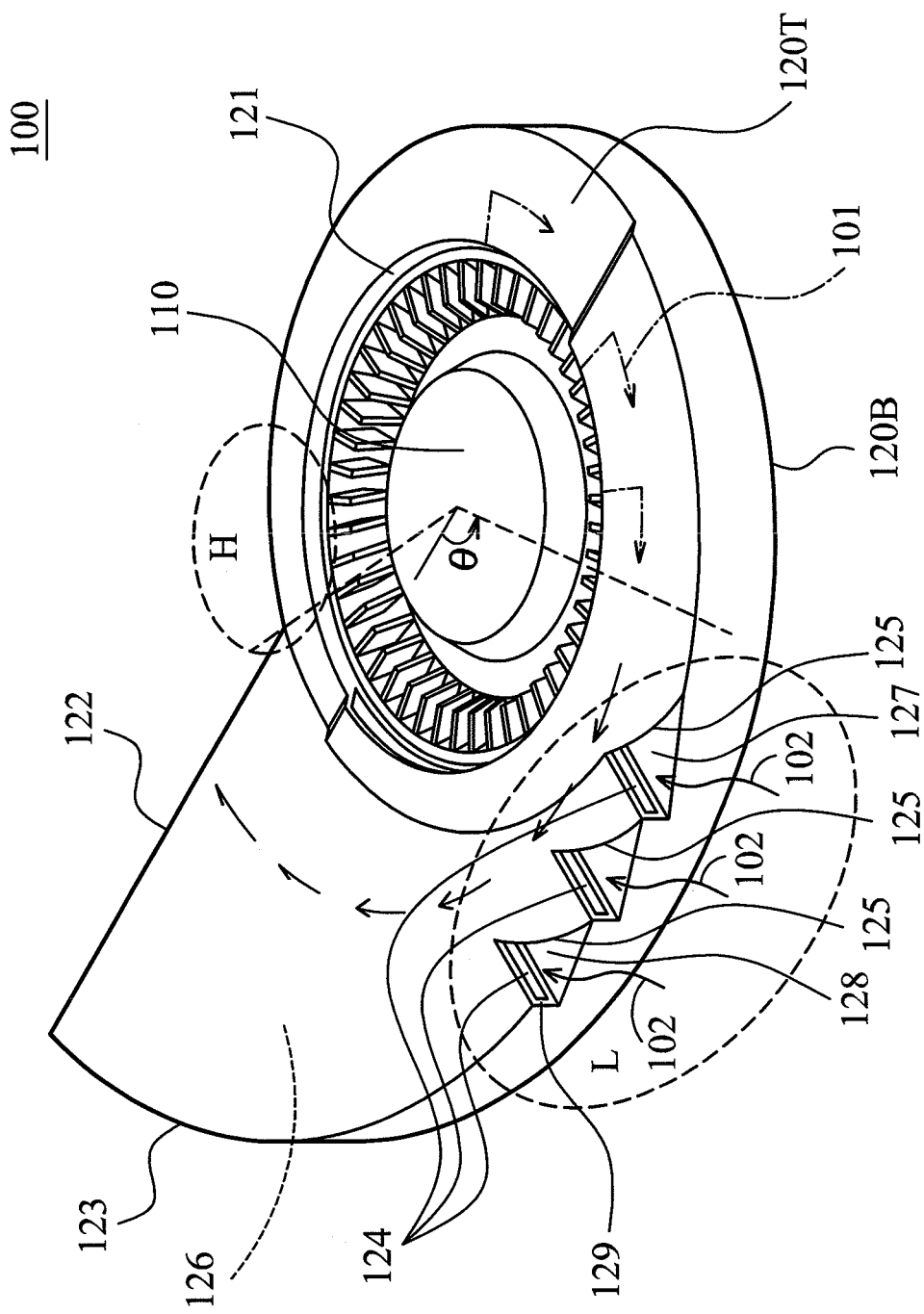
FIG. 1B is a perspective view of the centrifugal fan of an embodiment of the invention.

FIGS. 1A and 1B show a centrifugal fan 100 of an embodiment of the invention, including an impeller 110 and a housing 120. An inlet 121 and an outlet 122 are formed on the housing 120. The inlet 121 is perpendicular to the outlet 122. A flow path 126 communicates the inlet 121 to the outlet 122. The housing 120 includes an upper plate 120T, a lower plate 120B and a side wall 123. The impeller 110 is disposed in the inlet 121. At least one auxiliary inlet 124 is formed in a guiding groove 127 of the housing 120. The auxiliary inlets 124 face to the outlet 122. When the centrifugal fan 100 operates, a major flow 101 is impelled by the impeller 110, entering the housing 120 through the inlet 121, and passing through the flow path 126, and then, it is output through the outlet 122.

An auxiliary flow 102 is guided by the guiding grooves 127, and enters the housing 120 through the auxiliary inlets 124. Each guiding groove 127 comprises an inclined guiding slope 128 and a guiding sheet 125, and the guiding sheet 125 is adjacent to the guiding slope 128 and extended laterally. The guiding slope 128 axially inclines downwardly from the upper plate 120T toward an extension direction of the auxiliary inlet 124, and the guiding sheet 125 is adjacent to the auxiliary inlet 124. In this embodiment, the guiding sheets 125 and the housing 120 are integrally formed.

The auxiliary flow 102 is guided by the guiding sheets 125, entering the housing 120 through the auxiliary inlets 124, and passes through the flow path 126, and then, the auxiliary flow 102 is output through the outlet 122. Each guiding sheet 125 curvedly extends from the side wall 123 into the housing toward the outlet 122. Each guiding groove 127 comprises a fringe wall 129, extending axially downward from the upper plate 120T, adjacent to the guiding slope 128 and the guiding sheet 125, and the auxiliary inlet 124 is formed on the fringe wall 129. It is preferred to not dispose the auxiliary inlet 124 on a surface of the side wall. An included angle is formed between the auxiliary inlet 124 and the side wall 123.

In this embodiment, a side wall 123 is an involute wall, and a center of the base circle of the involute wall is on an axle of the impeller 110.

Figure 1C:
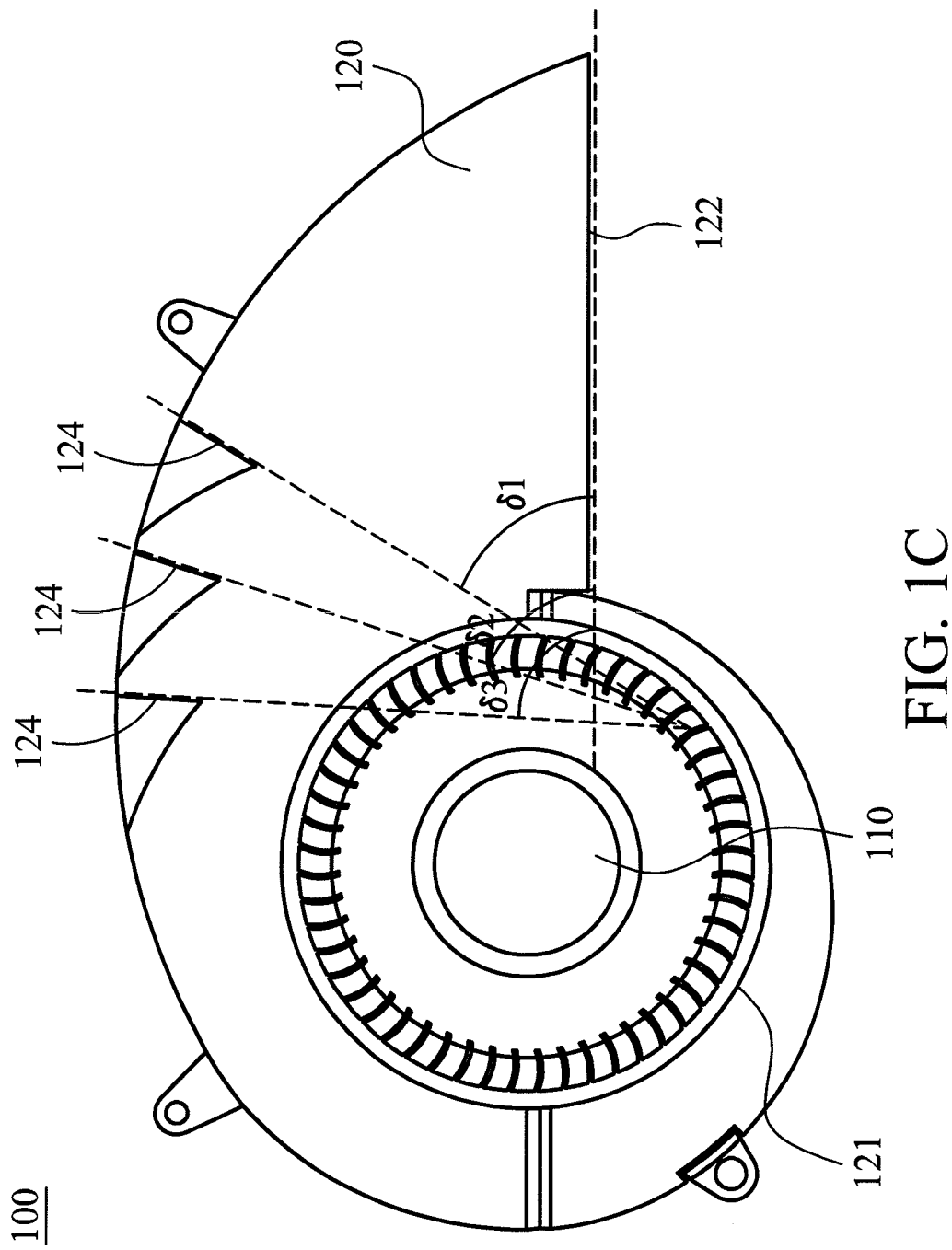
FIG. 1C shows the centrifugal fan of a modified embodiment of the invention.

With reference to FIGS. 1A and 1B, the flow path comprises a high pressure area H and a low pressure area L, wherein the high pressure area H has a relatively narrower path width, and the low pressure area L has a relatively wider path width. In FIG. 1, the low pressure area L is disposed where the included angle θ is about between 0° to 135°. The involute wall 123 has a generating line extending on a tangent line of the base circle of the involute wall, and the auxiliary inlets 124 are substantially located on the involute wall 123 where the generating line has the greatest length.

Utilizing the centrifugal fan of the embodiment of the invention, the auxiliary inlets 124 are formed in the low pressure area L, and the auxiliary flow 102 is sufficiently impelled, thus, eddy flow is prevented, flow rate is increased, and uniformity of the output flow is improved. Even in an electronic device with limited inner space, the centrifugal fan of the embodiment of the invention provides improved heat dissipation effect.

In the embodiment of the invention, the impeller 110 can be a wave-blade impeller, wheel-blade impeller or other impellers.

In the embodiment of the invention, the inlet 121 is an axial inlet, and the auxiliary inlets 124 are lateral inlets. The air entering directions of the auxiliary inlets 124 are substantially perpendicular to an air entering direction of the inlet 121.

Included angles are formed between extension directions of the auxiliary inlets 124 and an extension direction of the outlet 122, and the included angles are between 45° and 100°. In one embodiment, with reference to FIG. 1C, the included angle between the extension direction of the auxiliary inlet 124 closer to the outlet 122 to the extension direction of the outlet 122 decreases, and the included angle between the extension direction of the auxiliary inlet 124 farther away from the outlet 122 and the extension direction of the outlet 122 increases ($\delta 1 < \delta 2 < \delta 3$). In another embodiment, all the included angles between the extension directions of the auxiliary inlets 124 and the extension direction of the outlet 122 are the same. In further another embodiment, the extension directions of the auxiliary inlets 124 are substantially perpendicular to the extension direction of the outlet 122.

Figure 2:
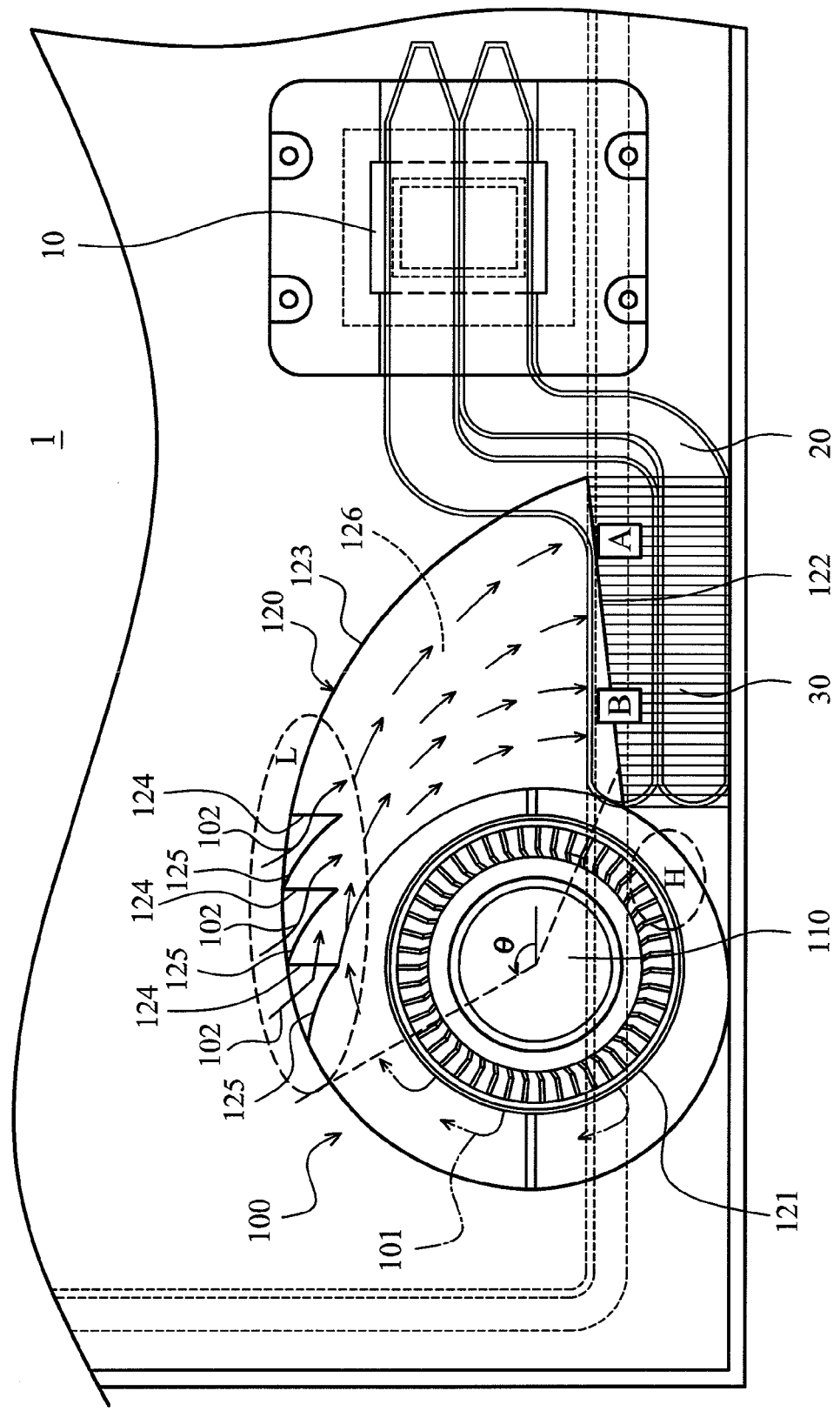
FIG. 2 shows an electronic device of an embodiment of the invention.

FIG. 2 shows an electronic device 1 of an embodiment of the invention, comprising a heat source 10, a heat conducting element 20, a heat sink 30 and the centrifugal fan 100. The heat conducting element 20 is connected to the heat source 10. The heat sink 30 is connected to the heat conducting element 20. The centrifugal fan 100 comprises the impeller 110 and the housing 120. When the electronic device 1 operates, the heat on the heat source 10 is transmitted to the heat sink 30 via the heat conducting element 20. The major flow 101 is impelled by the impeller 110, entering the housing 120 through the inlet 121, and passing through the flow path 126, and then, it is output through the outlet 122 to remove the heat from the heat sink 30. The auxiliary flow 102 is guided by the guiding sheets 125, entering the housing 120 through the auxiliary inlets 124, passing through the flow path 126, and then, it is output through the outlet 122 toward the heat sink 30 to increase flow rate and to improve heat dissipation.

In the embodiment above, the heat sink 30 and the centrifugal fan 100 can be defined as a heat dissipation module.

In the embodiment above, the heat source 10 can be a chip. The heat conducting element 20 can be a heat pipe. The heat sink 30 can comprise a plurality of fins.

As shown in FIG. 2, in the embodiment of the invention, the auxiliary inlets 124 are formed in the low pressure area. Thus, auxiliary flow is sufficiently impelled, and uniformity of the output flow is improved. In the conventional centrifugal fan, the major portion of the output flow passes through area A, and only a small portion of the output flow passes through area B, thus, the output flow is non-uniform, and only the heat on the portion in area A of the heat sink 30 can be dissipated. Utilizing the auxiliary inlet 124 of the embodiment of the invention, the output flow can uniformly pass through area A and area B, and heat dissipation is improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A centrifugal fan, comprising:
   an impeller; and
   a housing, comprising an upper plate, a lower plate and a side wall, wherein the upper plate axially corresponds to the lower plate, a side wall is formed between the upper plate and the lower plate, an axial inlet is formed on the upper plate, a lateral outlet is formed on the side wall, the impeller is disposed in the housing and corresponds to the axial inlet, and a flow path communicates the axial inlet to the outlet, wherein the housing further comprises a guiding groove, and at least one auxiliary inlet is formed in the guiding groove,
   wherein an included angle is formed between a plane, parallel to a rotation axis of the impeller, where the auxiliary inlet is located on and a plane, parallel to the rotation axis of the impeller, where the outlet is located on, and the included angle is between 45° and 100°, and
   wherein the flow path comprises a high pressure area and a low pressure area, the low pressure area having a pressure lower than that of the high pressure area,
   wherein the high pressure area has a path width narrower than a path width of the low pressure area and
   wherein the auxiliary inlet is located in the low pressure area at an end of the flow path closer to the lateral outlet.

2. The centrifugal fan as claimed in claim 1, wherein the guiding groove guides an auxiliary flow, and the auxiliary flow enters the housing through the auxiliary inlet.

3. The centrifugal fan as claimed in claim 2, wherein the guiding groove comprises an inclined guiding slope, and the guiding slope is inclined toward an end of the auxiliary inlet from a surface of the housing.

4. The centrifugal fan as claimed in claim 3, wherein the guiding groove comprises a guiding sheet adjacent to the guiding slope and extended laterally.

5. The centrifugal fan as claimed in claim 4, wherein the guiding slope axially inclines downwardly from the upper plate toward the end of the auxiliary inlet.

6. The centrifugal fan as claimed in claim 5, wherein the guiding sheet extends from the side wall into the housing toward the outlet.

7. The centrifugal fan as claimed in claim 6, wherein the guiding sheet extends curvedly.

8. The centrifugal fan as claimed in claim 4, wherein the guiding groove comprises a fringe wall, extending axially downward from the upper plate, adjacent to the guiding slope and the guiding sheet, and the auxiliary inlet is formed on the fringe wall.

9. The centrifugal fan as claimed in claim 1, wherein the auxiliary inlet is a lateral inlet.

10. The centrifugal fan as claimed in claim 9, wherein an air entering direction of the auxiliary inlet is substantially perpendicular to an air entering direction of the axial inlet.

11. The centrifugal fan as claimed in claim 10, wherein the plane where the auxiliary inlet is located on is parallel to the air entering direction of the axial inlet, and the plane where the outlet is located on is parallel to the air entering direction of the axial inlet.

12. The centrifugal fan as claimed in claim 1, wherein a first included angle is formed between a first plane where a first auxiliary inlet of the at least one auxiliary inlet is located on and the plane where the outlet is located on, and a second included angle is formed between a second plane where a second auxiliary inlet of the at least one auxiliary inlet is located on and the plane where the outlet is located on, and the first auxiliary inlet is closer to the outlet relative to the second auxiliary inlet, and the first included angle is smaller than the second included angle.

13. The centrifugal fan as claimed in claim 1, wherein a first extension direction of the first auxiliary inlet of the at least one auxiliary inlet and a second extension direction of a second auxiliary inlet of the at least one auxiliary inlet are substantially perpendicular to an extension direction of the outlet.

14. The centrifugal fan as claimed in claim 1, wherein the side wall is an involute wall, a center of a base circle of the involute wall is on an axle of the impeller, the involute wall has a generating line, and the auxiliary inlet is substantially located on the involute wall where the generating line has the greatest length.

15. The centrifugal fan as claimed in claim 1, wherein an included angle is formed between the auxiliary inlet and a surface of the side wall.

16. A heat dissipation module, comprising:
a heat sink; and
the centrifugal fan as claimed in claim 1, wherein the centrifugal fan is adjacent to a side of the heat sink.

17. An electronic device, comprising:
a heat source;
a heat conducting element, connected to the heat source;
a heat sink, connected to the heat conducting element, wherein heat generated by the heat source is moved to the heat sink via the heat conducting element; and
the centrifugal fan as claimed in claim 1, wherein the centrifugal fan is adjacent to a side of the heat sink.

18. The centrifugal fan as claimed in claim 1, wherein in the flow path, the low pressure area is located between the high pressure area and the outlet.

* * * * *